United States Patent
Quan et al.

(10) Patent No.: US 7,724,092 B2
(45) Date of Patent: May 25, 2010

(54) DUAL-PATH CURRENT AMPLIFIER

(75) Inventors: Xiaohong Quan, San Diego, CA (US);
Marzio Pedrali-Noy, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 11/866,851

(22) Filed: Oct. 3, 2007

(65) Prior Publication Data
US 2009/0091393 A1    Apr. 9, 2009

(51) Int. Cl.
*H03F 3/68* (2006.01)
(52) U.S. Cl. ........................ 330/288; 330/295
(58) Field of Classification Search ............... 330/288, 330/295
See application file for complete search history.

(56) References Cited

U.S. PATENT DOCUMENTS

| | | | | |
|---|---|---|---|---|
| 5,270,591 | A * | 12/1993 | Ross | ............................ 327/57 |
| 6,433,626 | B1 | 8/2002 | Guimaraes | |
| 2005/0083130 | A1 * | 4/2005 | Grilo | ........................ 330/288 |
| 2007/0159262 | A1 | 7/2007 | Quan et al. | |

FOREIGN PATENT DOCUMENTS

EP          0715239          6/1996

OTHER PUBLICATIONS

International Search Report - PCT/US08/078510, International Searching Authority - European Patent Office, Mar. 20, 2009.
Written Opinion - PCT/US08/078510, International Searching Authority - European Patent Office, Mar. 20, 2009.

* cited by examiner

*Primary Examiner*—Steven J Mottola
(74) *Attorney, Agent, or Firm*—Howard H. Seo; William M. Hooks

(57) ABSTRACT

A dual-path current amplifier having a slow high-gain path and a fast low-gain path is described. In one design, the slow high-gain path is implemented with a positive feedback loop and has a gain of greater than one and a bandwidth determined by a pole. The fast low-gain path has unity gain and wide bandwidth. The two signal paths receive an input current and provide first and seconds currents. A summer sums the first and second currents and provides an output current for the dual-path current amplifier. The dual-path current amplifier may be implemented with first and second current mirrors. The first current mirror may implement the fast low-gain path. The first and second current mirrors may be coupled together and implement the slow high-gain path. The first current mirror may be implemented with P-FETs. The second current mirror may be implemented with N-FETs, an operational amplifier, and a capacitor.

34 Claims, 9 Drawing Sheets

DUAL-PATH CURRENT AMPLIFIER

BACKGROUND

I. Field

The present disclosure relates generally to electronics circuits, and more specifically to an amplifier.

II. Background

Amplifiers are commonly used to amplify input signals to obtain output signals having the desired signal level. Various types of amplifiers are available and include voltage amplifiers, current amplifiers, etc. A voltage amplifier receives and amplifies an input voltage signal and provides an output voltage signal. A current amplifier receives and amplifies an input current signal and provides an output current signal. Voltage and current amplifiers typically have different designs and are used in different applications.

An amplifier may be designed to implement a particular transfer function, which may be dependent on an application for which the amplifier is used. Various circuit elements (e.g., transistors, resistors, capacitors, etc.) may be used to implement the transfer function. It is desirable to design the amplifier to obtain the transfer function while minimizing cost, size, power, etc.

SUMMARY

A dual-path current amplifier having a slow high-gain path and a fast low-gain path is described herein. The fast low-gain path is a signal path having low gain and wide bandwidth. The slow high-gain path is a signal path having high gain and low bandwidth relative to the fast low-gain path. The slow high-gain path and the fast low-gain path may be implemented with various circuit designs, as described below. The dual-path current amplifier may be used for various applications such as a phase-locked loop (PLL) having two control paths to achieve wide tuning range and good PLL loop dynamics.

In one design of the dual-path current amplifier, the slow high-gain path has a gain of greater than one and a bandwidth determined by a pole in the slow high-gain path. The slow high-gain path is implemented with a positive feedback loop having a loop gain of less than one. The fast low-gain path has unity gain and a wide bandwidth determined by parasitics of circuit elements in the fast low-gain path. The slow high-gain path receives an input current and provides a first current. The fast low-gain path also receives the input current and provides a second current. A summer (e.g., a current summing node) sums the first and second currents and provides an output current for the dual-path current amplifier.

In one design, the dual-path current amplifier includes first and second current mirrors. The first current mirror implements the fast low-gain path. The first and second current mirrors are coupled together and implement the slow high-gain path. The first current mirror may be implemented with first, second, and third P-channel field effect transistors (P-FETs) connected in parallel. The first P-FET may be connected in a diode configuration and may provide a gate voltage for the second and third P-FETs. The second current mirror may be implemented with first and second N-channel field effect transistors (N-FETs), an operational amplifier, and a capacitor. The first and second N-FETs may be connected in parallel and have their drains connected to the drains of the first and second P-FETs, respectively. The operational amplifier may have two inputs connected to the drains of the first and second N-FETs and an output connected to the gates of these N-FETs. The capacitor may be connected between the gates of the N-FETs and circuit ground. This design may provide certain advantages, as described below.

Various aspects and features of the disclosure are described in further detail below.

DETAILED DESCRIPTION

The dual-path current amplifier described herein may be used for various applications. The use of the dual-path current amplifier in a PLL is described below.

Figure 1:
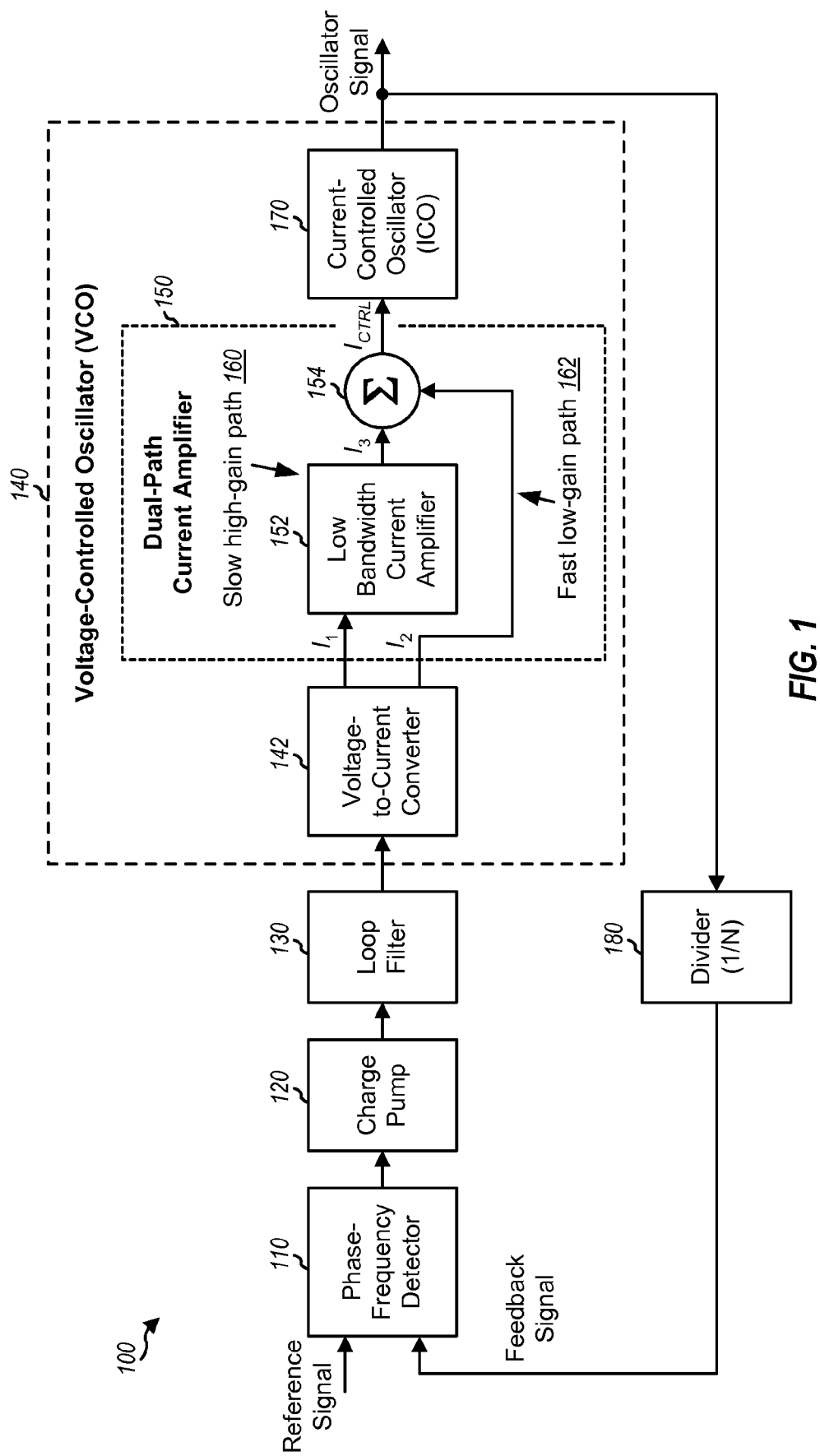
FIG. 1 shows a block diagram of a dual-path PLL.

FIG. 1 shows a block diagram of a design of a dual-path PLL 100 that can effectively handle a large VCO gain. PLL 100 includes a phase-frequency detector 110, a charge pump 120, a loop filter 130, a voltage-controlled oscillator (VCO) 140, and a divider 180. VCO 140 includes a voltage-to-current converter 142, a dual-path current amplifier 150, and a current-controlled oscillator (ICO) 170.

ICO 170 generates an oscillator signal having a frequency that is determined by a control current $I_{CTRL}$ from current amplifier 150. Divider 180 divides the oscillator signal by a factor of N in frequency, where $N \geq 1$, and provides a feedback signal. Phase-frequency detector 110 receives a reference signal and the feedback signal, compares the phases of the two signals, and provides a detector signal that indicates the phase difference/error between the two signals. Charge pump 120 generates an error signal that is proportional to the detected phase error. Loop filter 130 filters the error signal and provides a control voltage for VCO 140. Loop filter 130 adjusts the control voltage such that the phase or frequency of the feedback signal is locked to the phase or frequency of the reference signal.

Voltage-to-current converter 142 receives the control voltage from loop filter 130 and generates a first current $I_1$ and a second current $I_2$. In general, the first current $I_1$ may be equal to, greater than, or less than the second current $I_2$. In the design shown in FIG. 1, current amplifier 150 includes a low bandwidth current amplifier 152 and a summer 154. Amplifier 152 amplifies and filters the first current $I_1$ and provides a third current $I_3$. Summer 154 sums the second current $I_2$ with the third current $I_3$ and provides the control current $I_{CTRL}$ for ICO 170.

VCO 140 may have a wide tuning range, and the VCO gain may be large. The VCO gain is roughly equal to the tuning range of the VCO divided by the control voltage range for the VCO. The large tuning range for VCO 140 may be effectively handled with dual-path current amplifier 150. Current amplifier 150 has two signal paths—a slow high-gain path 160 and a fast low-gain path 162. In the design shown in FIG. 1, slow high-gain path 160 has a gain of greater than one and a frequency response determined by low bandwidth current amplifier 154. Fast low-gain path 162 has a gain of one and a flat frequency response. The large VCO gain is split into two paths. Slow high-gain path 160 is used for a high VCO gain path that slowly adjusts the center frequency of VCO 140. Fast low-gain path 162 is used for a small VCO gain path that adjusts the instantaneous frequency of VCO 140 during normal operation. Slow high-gain path 160 may be designed to avoid perturbing the normal operation of fast low-gain path 162. The VCO gain splitting is done after the voltage-to-current conversion. This may allow for efficient implementation of voltage-to-current converter 142 and current amplifier 150 and may also provide other benefits.

Figure 2A:
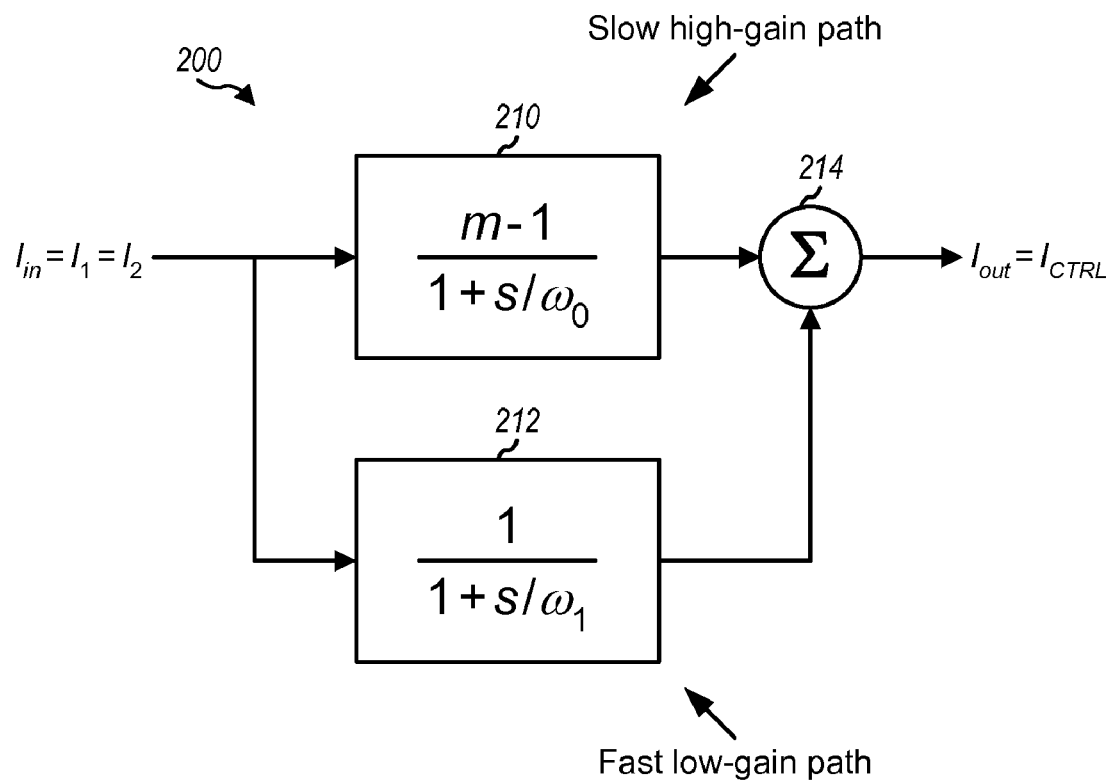
FIGS. 2A and 2B show an s-domain model and a transfer function, respectively, for one design of a dual-path current amplifier.

FIG. 2A shows a block diagram of an s-domain model 200 for a design of dual-path current amplifier 150 in FIG. 1. In model 200, slow high-gain path 160 is implemented by a block 210 having the transfer function shown in FIG. 2A. Slow high-gain path 160 has a gain of m−1 and a bandwidth of $\omega_0$, where m>1 and $\omega_0$ is a suitably selected frequency. Fast low-gain path 162 is implemented by a block 212 having the transfer function shown in FIG. 2A. Fast low-gain path 162 has unity gain and a bandwidth of $\omega_1$, where $\omega_1 \gg \omega_0$. Summer 154 is implemented by a summer 214.

Block 212 may be replaced with a short or direct connection, as shown in FIG. 1, and $\omega_1$ may then be equal to infinity. In this case, a transfer function H(s) for current amplifier 150 with model 200 may be expressed as:

$$\frac{I_{out}}{I_{in}}(s) = H(s) = \frac{m \cdot \left(1 + \frac{s}{m \cdot \omega_0}\right)}{1 + \frac{s}{\omega_0}}. \quad \text{Eq (1)}$$

Figure 2B:
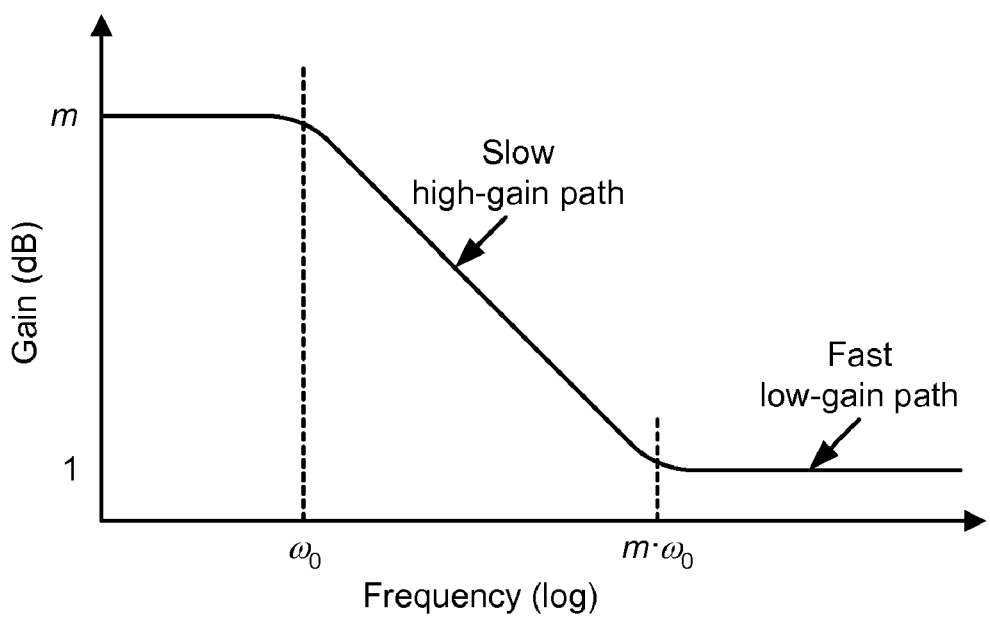

FIG. 2B shows a plot of transfer function H(s) in equation (1). As shown in FIG. 2B, transfer function H(s) has one pole at $\omega_0$ and one zero at $m \cdot \omega_0$. The current gain is m at low frequency of less than $\omega_0$. The current gain of m may be used to generate an average control current for ICO 170. The current gain is unity at high frequency greater than $m \cdot \omega_0$. The unity current gain may be used in lock or near-lock condition and may reduce jitter and/or improve PLL loop dynamics.

Current amplifier 150 introduces a pole-zero doublet to PLL 100, which is a closed-loop feedback system. PLL loop stability may be ensured by designing $m \cdot \omega_0$ to be much less than the PLL loop gain bandwidth and preferably below the first zero of loop filter 130.

Figure 3:
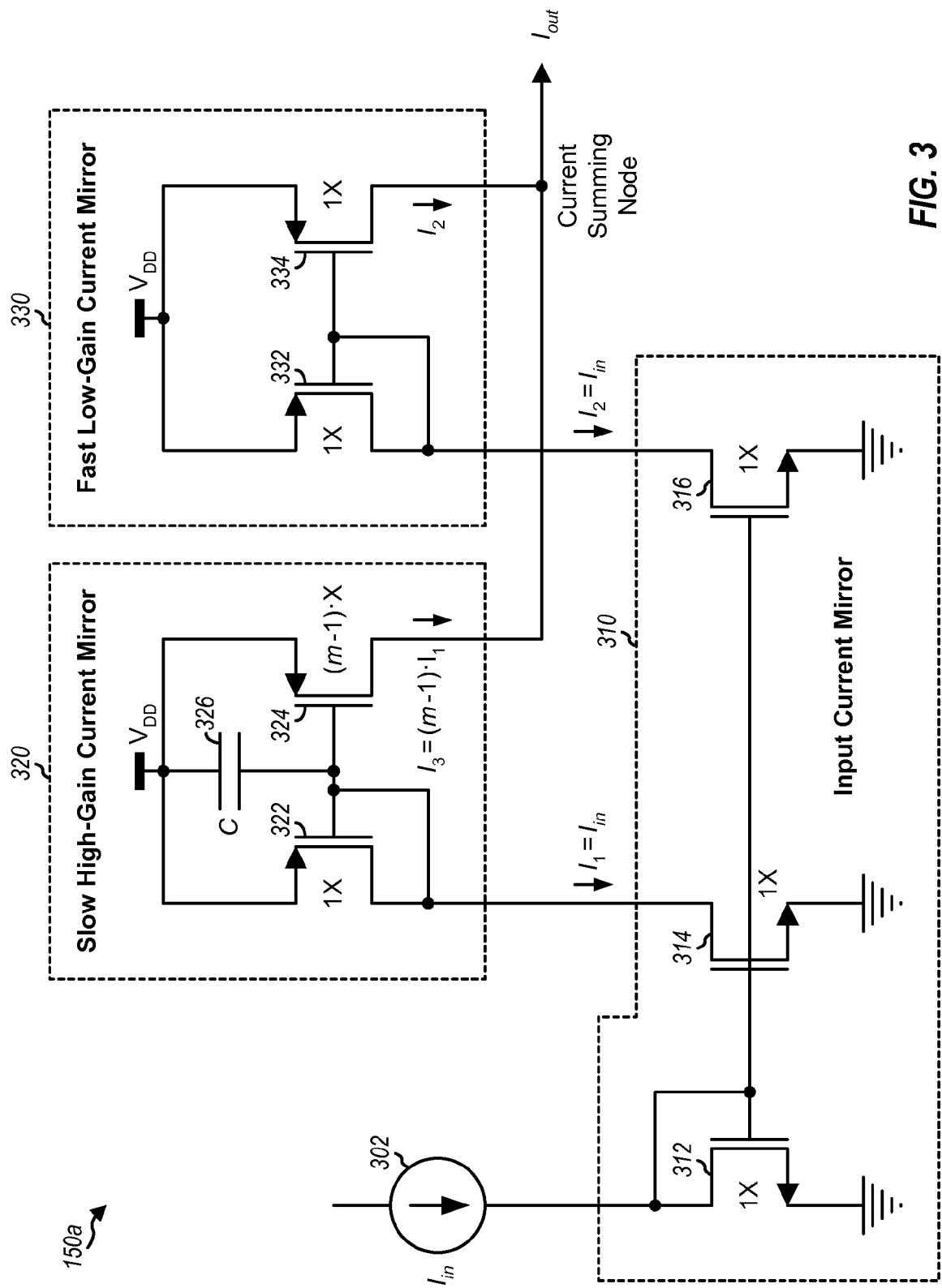
FIG. 3 shows a schematic diagram of a dual-path current amplifier implementing the s-domain model shown in FIG. 2A.

FIG. 3 shows a schematic diagram of a dual-path current amplifier 150a, which implements s-domain model 200 in FIG. 2A and is one design of dual-path current amplifier 150 in FIG. 1. In this design, current amplifier 150a includes three current mirrors—an input current mirror 310, a slow high-gain current mirror 320, and a fast low-gain current mirror 330. A current mirror is a circuit having multiple transistors connected in parallel, with their gates connected together and their sources connected to the same voltage, so that the current flowing through one transistor mirrors the current flowing through another transistor. In FIG. 3, current amplifier 150a is implemented in complementary metal oxide semiconductor (CMOS) with both N-FETs and P-FETs.

Input current mirror 310 includes N-FETs 312, 314 and 316 that are connected in parallel and have their gates connected together and their sources connected to circuit ground. N-FET 312 is connected in a diode configuration, which means that the gate and drain of N-FET 312 are connected together. The drain currents of N-FETs 314 and 316 are determined by (and mirror) the drain current of N-FET 312. A current source 302 provides an input current $I_{in}$, which may correspond to $I_1$ in FIG. 1.

Slow high-gain current mirror 320 includes P-FETs 322 and 324 that are connected in parallel and have their gates connected together and their sources connected to a power supply voltage $V_{DD}$. P-FET 322 is connected in a diode configuration and has its drain connected to its gate and further to the drain of N-FET 314 in current mirror 310. P-FET 324 has its drain connected to a current summing node. The drain current of P-FET 324 is determined by the dimensions of P-FETs 322 and 324 and the drain current of P-FET 322. A capacitor 326 has one end connected to the gates of P-FETs 322 and 324 and the other end connected to the supply voltage. The supply voltage and circuit ground are both considered as alternating current (AC) ground.

Fast low-gain current mirror 330 includes P-FETs 332 and 334 that are connected in parallel and have their gates connected together and their sources connected to the supply voltage. P-FET 332 is connected in a diode configuration and has its drain connected to its gate and further to the drain of N-FET 316 in current mirror 310. P-FET 334 has its drain connected to the current summing node. The drain current of P-FET 334 is determined by (and mirrors) the drain current of P-FET 332. The current summing node provides an output current $I_{out}$, which may correspond to $I_{CTRL}$ in FIG. 1.

In current mirror 310, N-FET 312 receives the input current $I_{in}$ and provides a gate voltage $V_g$ for N-FETs 314 and 316. N-FETs 312, 314 and 316 thus have the same gate-to-source voltage $V_{gs}$. If N-FETs 312, 314 and 316 have the same width/length (W/L) dimension, as shown in FIG. 3, then N-FET 314 provides $I_1 = I_{in}$ at its drain, and N-FET 316 provides $I_2 = I_{in}$ at its drain.

In current mirror 320, the drain current of P-FET 322 is equal to the drain current of N-FET 314. The drain current of P-FET 324 is m−1 times the drain current of P-FET 322 since both P-FETs have the same $V_{gs}$ voltage but P-FET 324 has dimension of (m−1)·X whereas P-FET 322 has dimension of 1X. P-FET 324 provides a drain current of $I_3 = (m-1) \cdot I_{in}$ to the current summing node. Current mirror 320 includes capacitor 326 that prevents fast changes to the gate voltage of P-FETs 322 and 324. Thus, the drain current $I_3$ changes at a slow rate determined by the size of capacitor 326 and other factors.

In current mirror 330, the drain current of P-FET 332 is equal to the drain current of N-FET 316. The drain current of P-FET 334 is equal to the drain current of P-FET 332 since P-FETs 332 and 334 have the same $V_{gs}$ voltage and also the same dimension. Hence, P-FET 334 provides a drain current of $I_{in}$ to the current summing node. Current mirror 330 does not include any reactive element (besides parasitics) and is thus fast.

When the input current $I_{in}$ changes, current mirror 330 responds to the change quickly whereas current mirror 320 takes some time to respond since the gate voltage of P-FETs 322 and 324 cannot change quickly due to capacitor 326. The bandwidth $\omega_0$ of current mirror 320, and hence the bandwidth of current amplifier 150a, may be expressed as:

$$\omega_0 = \frac{g_{mp}}{C}, \quad \text{Eq (2)}$$

where $g_{mp}$ is the transconductance of P-FET 322, and
C is the capacitance of capacitor 326.
Transconductance $g_{mp}$ is determined by the input current $I_{in}$ and the dimension or W/L ratio of P-FET 322 and is thus limited. A suitable capacitance value C may be selected to achieve the desired bandwidth $\omega_0$. A large capacitor may be used to obtain a low bandwidth, and vice versa.

The gain m−1 for current mirror 320 may be selected based on various factors such as the desired performance, circuit implementation, etc. If m−1 is too small, then the benefits of the dual-path VCO gain may be minimal. Conversely, if m−1 is too large, then the zero location at m·$\omega_0$ may be too high, which may impact PLL loop stability. In one design, m−1 is equal to seven. Other values may also be used for m−1.

FIG. 3 shows an efficient implementation of dual-path current amplifier 150a using a small number of FETs and one capacitor. Slow high-gain path 160 is implemented with current mirror 320 composed of two P-FETs 322 and 324 and one capacitor 326. Fast low-gain path 162 is implemented with current mirror 330 composed of two P-FETs 332 and 334. Current mirror 320 provides current multiplication with a fixed gain of m−1. The current summing node conveniently sums the drain currents of P-FETs 324 and 334 and provides the output current.

Figure 4A:
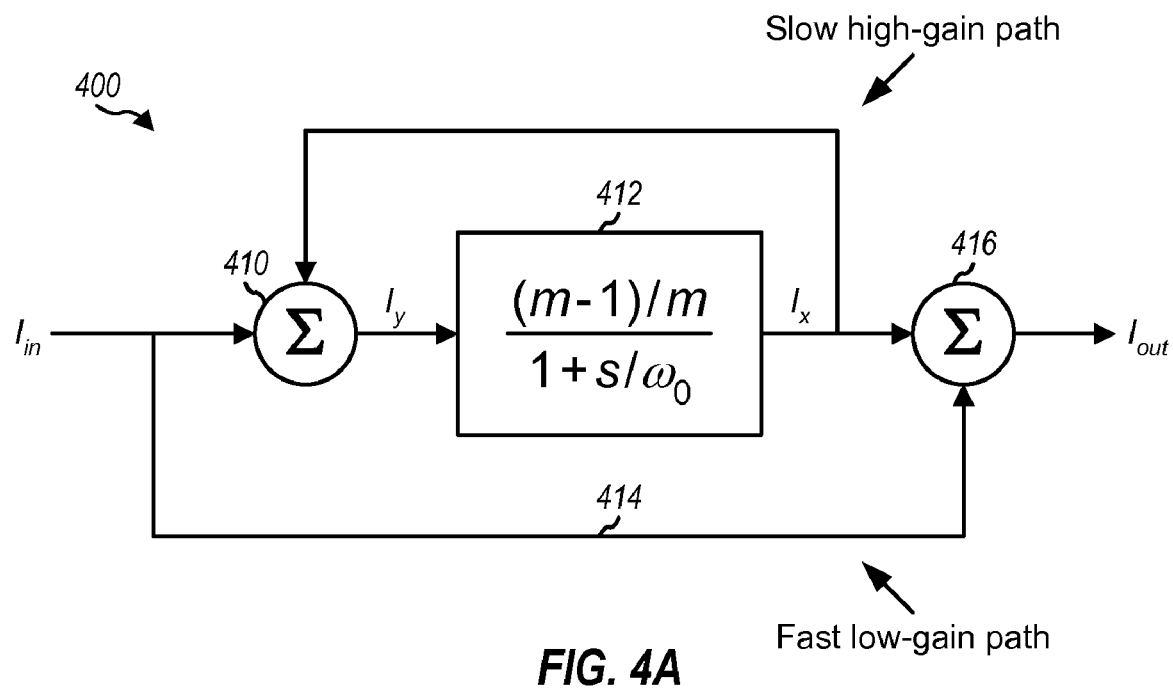
FIGS. 4A and 4B show an s-domain model and a transfer function, respectively, for another design of a dual-path current amplifier.

FIG. 4A shows a block diagram of an s-domain model 400 for another design of dual-path current amplifier 150 in FIG. 1. In model 400, slow high-gain path 160 is implemented by a summer 410 and a block 412 having the transfer function shown in FIG. 4A. Summer 410 sums the input current $I_{in}$ with an intermediate current $I_x$ from block 412 and provides a summed current $I_y$ to block 412. Slow high-gain path 160 is thus implemented with a positive feedback loop. The gain of block 412 is (m−1)/m, which is less than unity for all frequencies. Hence, the positive feedback loop is unconditionally stable. Fast low-gain path 162 is implemented by a line 414 having unity gain and infinite bandwidth. Summer 154 is implemented by a summer 416.

A transfer function G(s) for current amplifier 150 with model 400 may be expressed as:

$$\frac{I_{out}}{I_{in}}(s) = G(s) = \frac{m \cdot \left(1 + \frac{s}{\omega_0}\right)}{1 + \frac{s}{\omega_0/m}}. \quad \text{Eq (3)}$$

Figure 4B:
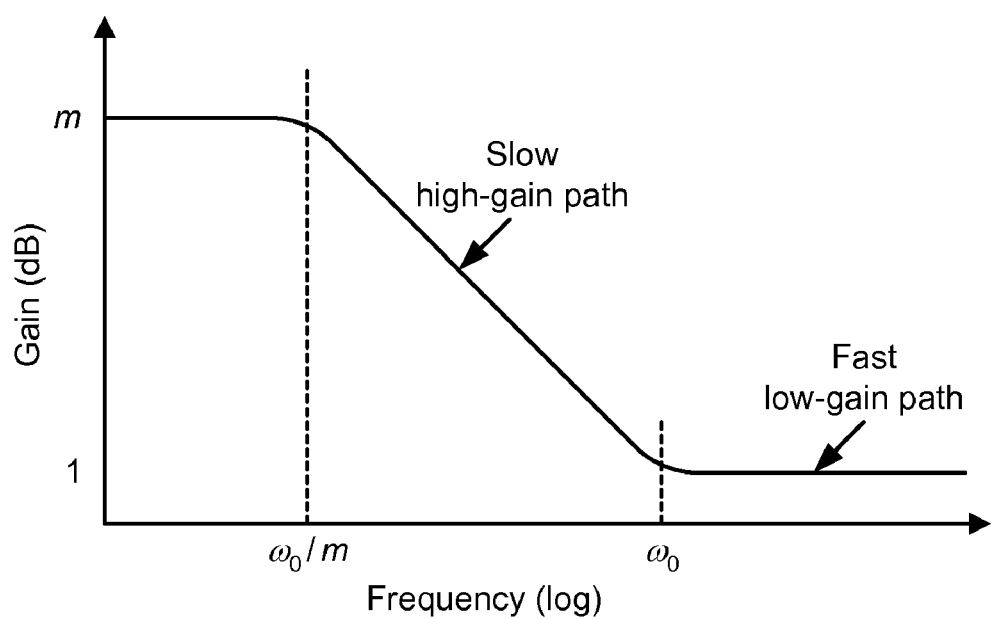

FIG. 4B shows a plot of transfer function G(s) in equation (3). As shown in FIG. 4B, transfer function G(s) has one pole at $\omega_0/m$ and one zero at $\omega_0$. The current gain is m at low frequency of less than $\omega_0/m$ and is unity at high frequency greater than $\omega_0$.

As shown in FIGS. 2B and 4B, transfer functions G(s) and H(s) each have one pole and one zero. However, the pole in transfer function G(s) is located at $\omega_0/m$ whereas the pole in transfer function H(s) is located $\omega_0$. The zero in transfer function G(s) is located at $\omega_0$ whereas the zero in transfer function H(s) is located m·$\omega_0$. Hence, for a given pole frequency, $\omega_0$ in transfer function G(s) may be m times higher than $\omega_0$ in transfer function H(s). This implies that transfer function G(s) may be implemented with a capacitor that is m times smaller than the capacitor used to implement transfer function H(s). The smaller capacitor occupies less die area if implemented on an integrated circuit (IC) and is thus highly desirable.

Figure 5:
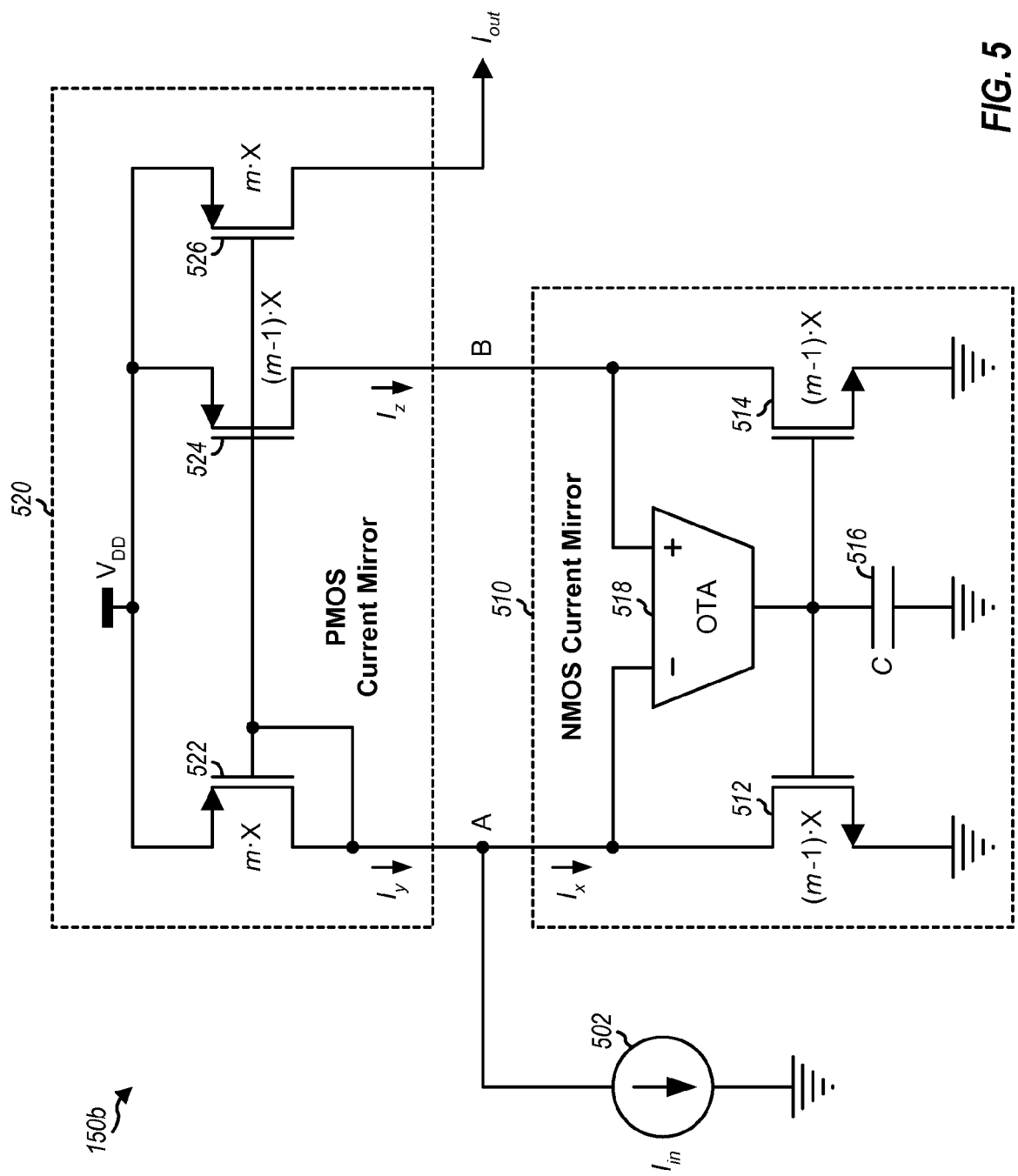
FIGS. 5, 6 and 7 show schematic diagrams of three designs of a dual-path current amplifier implementing the s-domain model shown in FIG. 4A.

FIG. 5 shows a schematic diagram of a dual-path current amplifier 150b, which implements model 400 in FIG. 4A and is another design of dual-path current amplifier 150 in FIG. 1. In this design, current amplifier 150b includes an NMOS current mirror 510 and a PMOS current mirror 520. A current source 502 provides the input current $I_{in}$, which may correspond to $I_1$ in FIG. 1, and is connected to node A.

NMOS current mirror 510 includes N-FETs 512 and 514, a capacitor 516, and an operational transconductance amplifier (OTA) 518. N-FETs 512 and 514 are connected in parallel and have their gates connected together and their sources connected to circuit ground. Capacitor 516 has one end connected to the gates of N-FETs 512 and 514 and the other end connected to circuit ground. OTA 518 has its inverting input connected to the drain of N-FET 512 (which is node A), its non-inverting input connected to the drain of N-FET 514 (which is node B), and its output connected to the gates of N-FETs 512 and 514. N-FETs 512 and 514 each have dimension of (m−1)·X.

OTA 518 implements a positive feedback loop and a negative feedback loop. The positive feedback loop is around N-FET 512, and the negative feedback loop is around N-FET 514. The negative feedback loop has higher loop gain than that of the positive feedback loop and thus dominates the positive feedback loop. As a result, the voltage at node A is equal to the voltage at node B. This improves current matching within NMOS current mirror 510 and also within PMOS current mirror 520 (between P-FETs 522 and 524). OTA 518 detects the difference between the voltages at nodes A and B and charges or discharges capacitor 516 such that the voltage at node A is equal to the voltage at node B. OTA 518 ensures that the drain-to-source voltage $V_{ds}$ of N-FET 512 closely matches the $V_{ds}$ of N-FET 514. Hence, the operating point of N-FET 512 closely matches the operating point of N-FET 514 since these N-FETs have the same $V_{gs}$ and $V_{ds}$. The negative feedback loop with OTA 518 allows for accurate matching of the drain current of N-FET 512 to the drain current of N-FET 514. The drain current of N-FET 512 corresponds to the intermediate current $I_x$ from block 412 in FIG. 4A. OTA 518 also allows for accurate current mirroring of the drain current of P-FET 522 to the drain current of P-FET 524.

PMOS current mirror 520 includes P-FETs 522, 524 and 526 that are coupled in parallel and have their gates coupled together and their sources coupled to the supply voltage. P-FET 522 is coupled in a diode configuration and has its drain coupled to its gate and further to the drain of N-FET 512 in NMOS current mirror 510. P-FET 524 has its drain coupled to the drain of N-FET 514. The drain of P-FET 526 provides the output current $I_{out}$, which may correspond to $I_{CTRL}$ in FIG. 1. P-FETs 522 and 526 each have dimension of m·X, and P-FET 524 has dimension of (m−1)·X. The drain current of P-FET 522 is equal to $I_y=I_{in}+I_x$. The drain currents of P-FETs 524 and 526 are determined by the drain current of P-FET 522.

In current amplifier 150b, fast low-gain path 162 is implemented by P-FETs 522 and 526 in PMOS current mirror 520. The drain current of P-FET 522 includes the input current $I_{in}$ and the intermediate current $I_x$. However, $I_x$ changes slowly and may be considered as static current for fast low-gain path 162. When the input current $I_{in}$ changes, the drain current of P-FET 522 varies quickly with the changing input current. The drain current of P-FET 526 is equal to the drain current of P-FET 522 because of the current mirror configuration. Hence, changes in the input current $I_{in}$ are reflected quickly in the output current $I_{out}$. P-FETs 522 and 526 have the same dimension of m·X, or a ratio of m/m, which results in a gain of one for fast low-gain path 162.

Slow high-gain path 160 is implemented with a first current mirror composed of P-FETs 522 and 524 and a second current mirror of N-FETs 512 and 514. Node A is a current summing node that implements summer 410 in FIG. 4A. The input current $I_{in}$ is summed with the intermediate current $I_x$ at node A, and the summed current $I_y=I_{in}+I_x$ is provided via P-FET 522. The drain current of P-FET 524 is equal to $I_z=$ ((m−1)/m)·$I_y$, which is (m−1)/m times the drain current of P-FET 522 because P-FET 522 has dimension of m·X whereas P-FET 524 has dimension of (m−1)·X. The drain current of N-FET 514 changes slowly due to capacitor 516, which then prevents the drain current of P-FET 524 from changing quickly with changes in $I_{in}$. P-FET 524 changes the voltage at node B whenever $I_{in}$ changes, and the change in the voltage at node B causes the $V_{gs}$ voltage of N-FET 514 to vary after a delay determined by capacitor 516 and OTA 518. The drain current of N-FET 514 is equal to $I_x$ once the $V_{gs}$ voltage of N-FET 514 settles. The drain current of N-FET 512 is equal to the drain current of N-FET 514 because of the current mirror configuration. N-FETs 512 and 514 and P-FETs 522 and 524 thus implement block 412 in FIG. 4A. At low frequency, $I_x$=(m−1)·$I_{in}$ due to positive feedback, and a gain of m−1 is achieved for slow high-gain path 160. The desired gain for slow high-gain path 160 may be achieved by dimensioning N-FETs 512 and 514 and P-FETs 522 and 524 with the proper sizes.

The bandwidth of the negative feedback loop within NMOS current mirror 510 may be expressed as:

$$\omega_0 = \frac{g_m}{C} \cdot \frac{g_{mn}}{g_{on} + g_{op}}, \quad \text{Eq (4)}$$

where $g_m$ is the transconductance of OTA 518,
$g_{mn}$ is the transconductance of N-FET 514,
$g_{on}$ is the output conductance of N-FET 514,
$g_{op}$ is the output conductance of P-FET 524, and
C is the capacitance of capacitor 516.

Transconductances $g_m$, $g_{mn}$, $g_{on}$ and $g_{op}$ are determined by the design of OTA 518, N-FET 514, and P-FET 524. A suitable capacitance value C may be selected for capacitor 516 to achieve the desired bandwidth $\omega_0$. Due to the gain of N-FET 514, which is G=$g_{mn}$/($g_{on}$+$g_{op}$), C may be G times larger to achieve the same $\omega_0$ as diode-connected N-FET 514.

Figure 6:
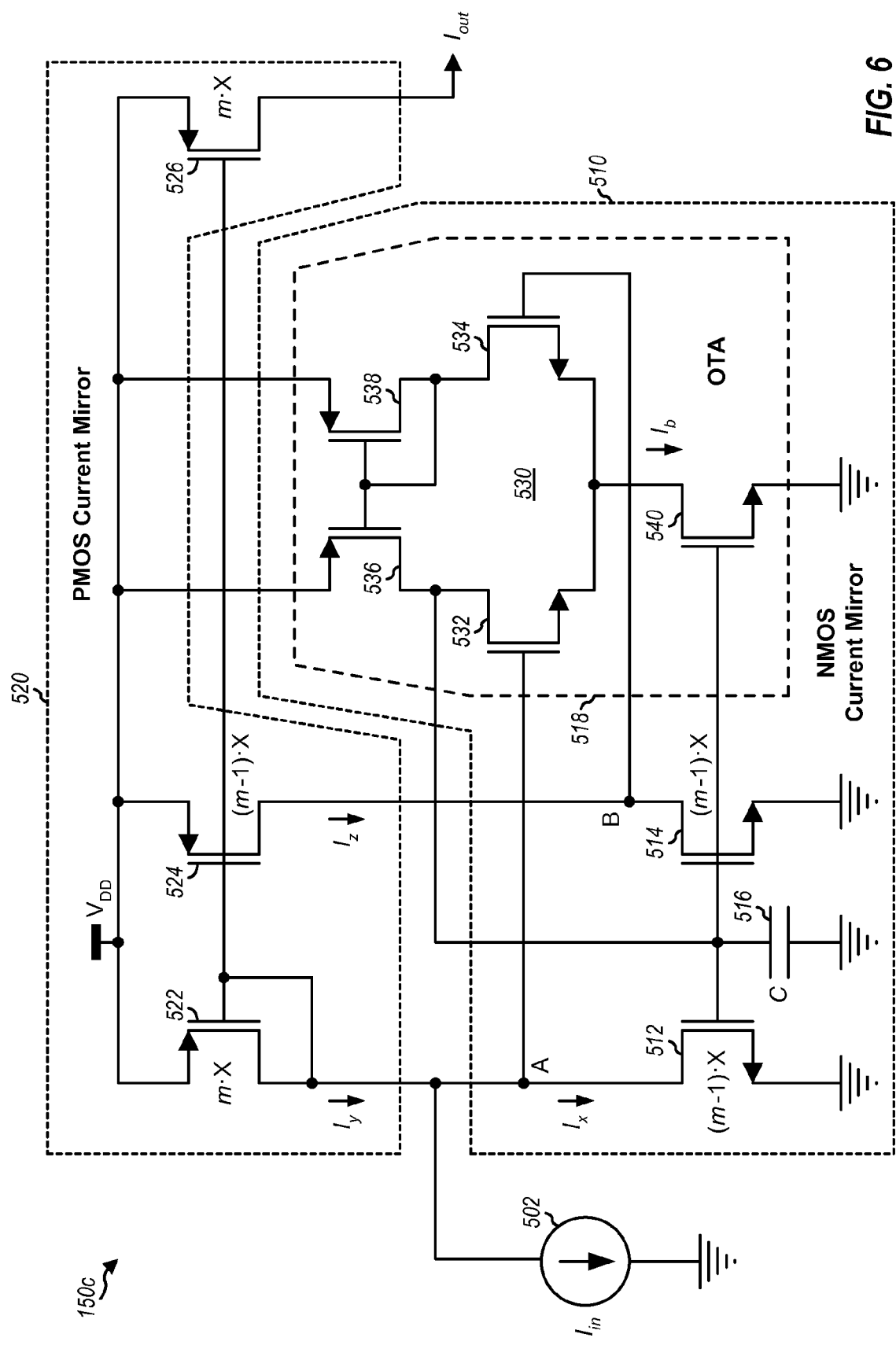

FIG. 6 shows a schematic diagram of a dual-path current amplifier 150c, which also implements the s-domain model 400 in FIG. 4A and is yet another design of dual-path current amplifier 150 in FIG. 1. Current amplifier 150c includes all of the circuit elements in current amplifier 150b in FIG. 5, with OTA 518 being implemented with a specific design.

In the design shown in FIG. 6, OTA 518 includes a differential amplifier 530 composed of N-FETs 532 and 534, an active load composed of P-FETs 536 and 538, and a bias N-FET 540. N-FETs 532 and 534 have their sources connected together and their gates connected to nodes A and B, respectively. N-FET 540 has its drain connected to the sources of N-FETs 532 and 534, its gate connected to the gates of N-FETs 512 and 514, and its source connected to circuit ground. P-FETs 536 and 538 have their sources connected to the supply voltage, their gates connected together, and their drains connected to the drains of N-FETs 532 and 534, respectively. The drain of P-FET 536 is further connected to the gates of N-FETs 512 and 514. The drain of P-FET 538 is further connected to the gate of P-FET 538.

N-FET 540 provides a bias current $I_b$, which is proportional to $I_x$, for both N-FETs 532 and 534. P-FETs 536 and 538 are connected as a current mirror, and each P-FET provides a current of approximately $I_b$/2 under steady state condition with the voltage at node A being equal to the voltage at node B. The voltage at node B rises when the input current $I_{in}$ increases and forces less current to flow through P-FET 524 in PMOS current mirror 520. In this case, the voltage at node A is lower than the voltage at node B, N-FET 532 is turned on less hard and draws less current, and P-FET 536 sources current into capacitor 516. The $V_{gs}$ of N-FETs 512 and 514 then rises, which allows N-FET 514 to draw more current from P-FET 524. Conversely, the voltage at node B drops when the input current $I_{in}$ decreases and causes more current to flow through P-FET 524. In this case, the voltage at node A is higher than the voltage at node B, and N-FET 532 is turned on harder and sinks current from capacitor 516. The $V_{gs}$ of N-FETs 512 and 514 then drops, which results in N-FET 514 drawing less current from P-FET 524.

The OTA design in FIG. 6 may have several advantages. First, the design is relatively simple, and OTA 518 is implemented with five transistors. Second, OTA 518 is self-biased since the bias current $I_b$ for N-FETs 532 and 534 may be obtained from a replica of the intermediate current $I_x$ in NMOS current mirror 510.

Figure 7:
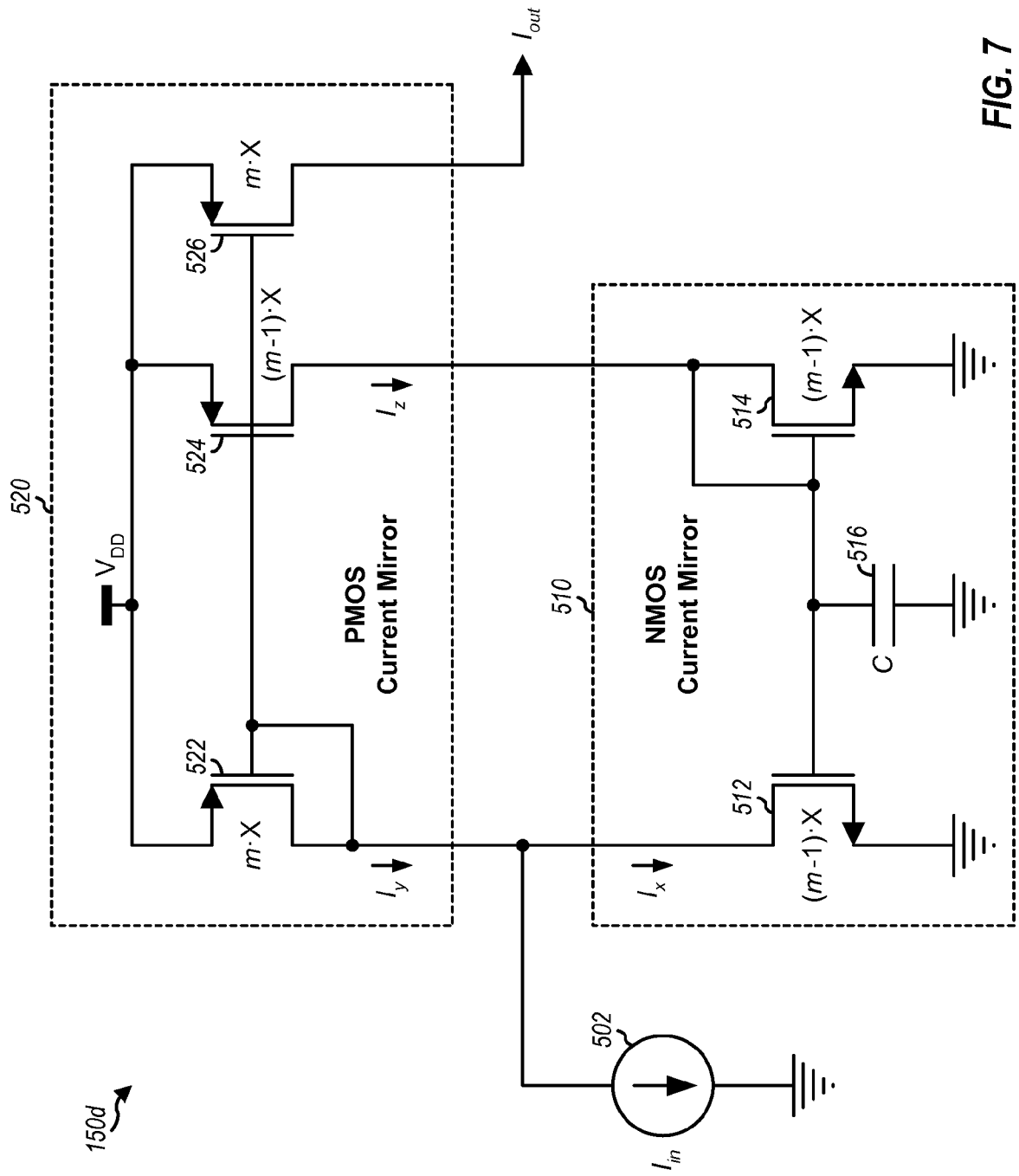

FIG. 7 shows a schematic diagram of a dual-path current amplifier 150d, which also implements model 400 in FIG. 4A and is yet another design of dual-path current amplifier 150 in FIG. 1. Current amplifier 150d includes all of the circuit elements in current amplifier 150b in FIG. 5, except for OTA 518. In this design, N-FET 514 is connected in a diode configuration and has its drain connected to its gate. The matching of the drain current of N-FET 512 to the drain current of N-FET 514 may be less accurate without OTA 518. However, accurate current matching may not be required in certain applications, and omitting OTA 518 may simplify the design of current mirror 150 for these applications. The loop bandwidth is $$\omega_0 = \frac{g_{mn}}{C},$$

is where $g_{mn}$ is the transconductance of N-FET 514. This allows for use of a smaller capacitor to achieve the same $\omega_0$ as in equation (4).

The designs of dual-path current amplifier 150 in FIGS. 5, 6 and 7 may have several advantages. First, a smaller capacitor 516 may be used to achieve a desired pole frequency for current amplifier 150 due to the positive feedback loop in the slow high-gain path. The smaller capacitor may reduce die area and cost, which are desirable. Second, combining NMOS current mirror 510 and PMOS current mirror 520 may reduce the number of transistors used to implement current amplifier 150.

Figure 8:
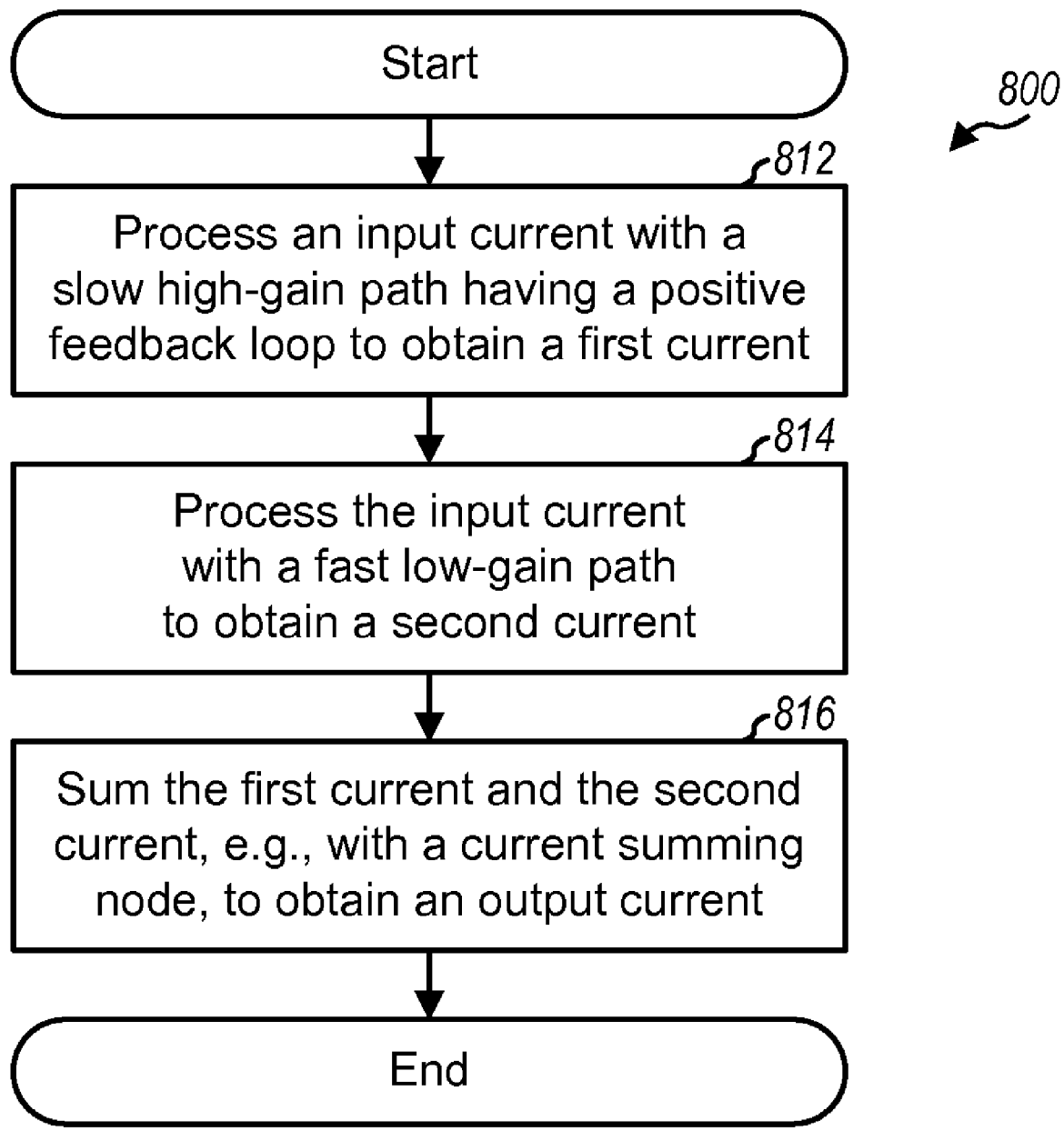
FIG. 8 shows a process for processing an input current.

FIG. 8 shows a design of a process 800 for processing an input current. The input current may be processed with a slow high-gain path having a positive feedback loop to obtain a first current (block 812). The input current may also be processed with a fast low-gain path to obtain a second current (block 814). The first current and the second current may be summed (e.g., by a current summing node) to obtain an output current (block 816).

For block 812, the input current and the first current may be summed to obtain a third current. The third current may then be processed in accordance with a transfer function having a gain of less than one and a pole at a particular frequency to obtain the first current. The slow high-gain path may have a gain of greater than one due to the positive feedback and a bandwidth determined by the pole in the slow high-gain path.

For block 814, the input current may be mirrored with a current mirror to obtain the second current. The fast low-gain path may have unity gain and a wide bandwidth determined by parasitics of circuit elements in the fast low-gain path.

The dual-path current amplifier described herein may be used for a PLL with a wide tuning range and a large VCO gain, e.g., as shown in FIG. 1. The large VCO gain may be split into a slow high-gain path and a fast low-gain path, both of which may be implemented with the dual-path current amplifier. The slow high-gain path may provide an average control current for the VCO to support wide tuning range. The fast low-gain path may provide an instantaneous control current for the VCO to support smaller VCO gain during locked condition. The smaller VCO gain may improve PLL loop stability and result in less jitter.

The dual-path current amplifier is especially advantageous for low voltage applications. Low power supply voltages are commonly used for portable devices to reduce power consumption. However, low supply voltages also limit the control voltage range, which makes the large VCO gain problem more pronounced. The dual-path current amplifier can support large VCO gain, which may be more severe in low voltage applications.

The dual-path current amplifier may be used for various electronics devices and circuits. The use of the dual-path current amplifier in a wireless communication device is described below.

Figure 9:
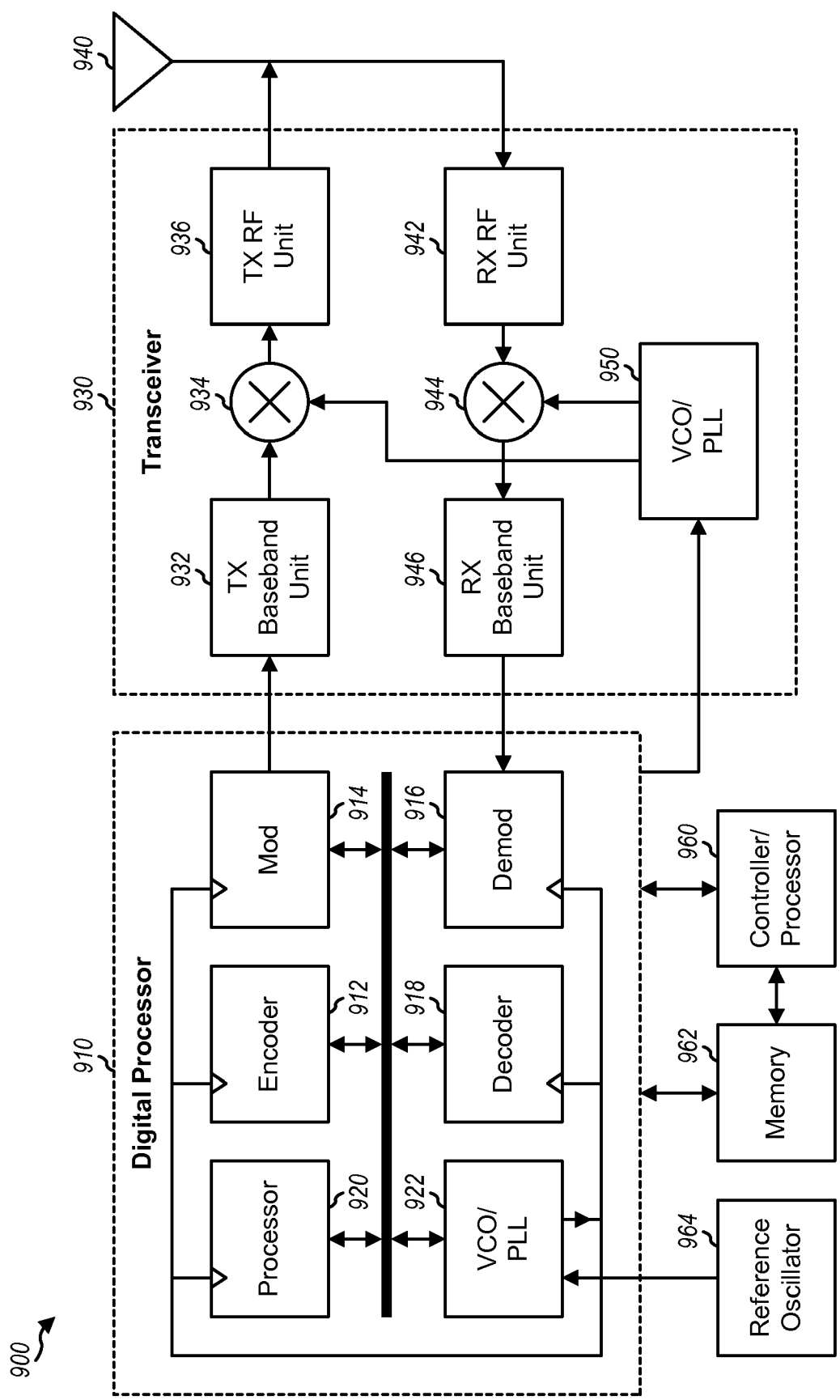
FIG. 9 shows a block diagram of a wireless communication device.

FIG. 9 shows a block diagram of a design of a wireless device 900 in a wireless communication system. Wireless device 900 may be a cellular phone, a terminal, a personal digital assistant (PDA), a handset, or some other devices or designs. The wireless communication system may be a Code Division Multiple Access (CDMA) system, a Time Division Multiple Access (TDMA) system, a Global System for Mobile Communications (GSM) system, a Frequency Division Multiple Access (FDMA) system, an Orthogonal FDMA (OFDMA) system, etc.

Wireless device 900 includes a digital processor 910 and a transceiver 930 that supports bi-directional communication. Digital processor 910 may be implemented with one or more application specific integrated circuits (ASICs), and transceiver 930 may be implemented with one or more radio frequency (RF) integrated circuits (RFICs).

Within digital processor 910, an encoder 912 processes (e.g., formats, encodes, and interleaves) data to transmitted, and a modulator (Mod) 914 further processes (e.g., modulates and scrambles) the coded data to generate output chips. Within transceiver 930, a transmit (TX) baseband unit 932 performs baseband processing such as digital-to-analog conversion, filtering, amplification, etc., on the output chips and provides a baseband signal. A mixer 934 upconverts the baseband signal to RF. A TX RF unit 936 performs signal conditioning such as filtering and power amplification and generates an RF modulated signal, which is transmitted via an antenna 940. For data reception, a receive (RX) RF unit 942 receives an input RF signal from antenna 940 and performs signal conditioning such as low noise amplification and filtering. A mixer 944 downconverts the conditioned RF signal from RF to baseband. An RX baseband unit 946 performs baseband processing such as filtering, amplification, analog-to-digital conversion, etc., and provides samples. A demodulator (Demod) 916 processes (e.g., descrambles and demodulates) the samples and provides symbol estimates. A decoder 918 processes (e.g., deinterleaves and decodes) the symbol estimates and provides decoded data. In general, the processing by data processor 910 and transceiver 930 is dependent on the radio technology utilized by the wireless system.

A processor 920 may support various applications such as video, audio, graphics, etc. A controller/processor 960 may direct the operation of various processing units within wireless device 900. A memory 962 may store program codes and data for wireless device 900.

A VCO/PLL 922 generates clock signals for the processing units within digital processor 910. A VCO/PLL 950 generates a transmit LO signal used by mixer 934 for frequency upconversion and a receive LO signal used by mixer 944 for frequency downconversion. VCO 922 and/or VCO 950 may have large VCO gains and may utilize the dual-path current amplifier described herein. The dual-path current amplifier may also be used in other blocks in FIG. 9. A reference oscillator 964 generates a reference signal for VCO/PLL 922 and/or VCO/PLL 950. Reference oscillator 964 may be a crystal oscillator (XO), voltage-controlled XO (VCXO), a temperature-compensated XO (TCXO), or some other type of oscillator.

The dual-path current amplifier described herein may be implemented in an analog IC, an RFIC, an ASIC, a digital signal processor (DSP), a digital signal processing device (DSPD), a programmable logic device (PLD), a field programmable gate array (FPGA), a processor, a controller, a micro-controller, a microprocessor, and other electronic units. The dual-path current amplifier may be implemented in various IC process technologies such as N-MOS, P-MOS, CMOS, BJT, GaAs, etc. The dual-path current amplifier may also be implemented with discrete components.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus comprising:
   a slow high-gain path having a positive feedback loop and configured to receive an input current and provide a first current;
   a fast low-gain path configured to receive the input current and provide a second current; and
   a summer configured to sum the first current and the second current and provide an output current.

2. The apparatus of claim 1, wherein the fast low-gain path has unity gain and a wide bandwidth determined by parasitics of circuit elements in the fast low-gain path.

3. The apparatus of claim 1, wherein the slow high-gain path has a gain of greater than one and a bandwidth determined by a pole in the slow high-gain path.

4. The apparatus of claim 1, wherein the slow high-gain path comprises
   an adder configured to sum the input current and the first current and provide a third current, and
   a circuit configured to receive the third current and provide the first current, the adder and the circuit implementing the positive feedback loop.

5. The apparatus of claim 4, wherein the circuit has a gain of less than one and a pole at a predetermined frequency.

6. A method comprising:
   processing an input current with a slow high-gain path having a positive feedback loop to obtain a first current;
   processing the input current with a fast low-gain path to obtain a second current; and
   summing the first current and the second current to obtain an output current.

7. The method of claim 6, wherein the processing the input current with the slow high-gain path comprises
  summing the input current and the first current to obtain a third current, and
  processing the third current in accordance with a transfer function having a gain of less than one and a pole at a particular frequency to obtain the first current.

8. The method of claim 6, wherein the processing the input current with the fast low-gain path comprises mirroring the input current to obtain the second current.

9. An apparatus comprising:
  means for processing an input current with a slow high-gain path having a positive feedback loop to obtain a first current;
  means for processing the input current with a fast low-gain path to obtain a second current; and
  means for summing the first current and the second current to obtain an output current.

10. The apparatus of claim 9, wherein the means for processing the input current with the slow high-gain path comprises
  means for summing the input current and the first current to obtain a third current, and
  means for processing the third current in accordance with a transfer function having a gain of less than one and a pole at a particular frequency to obtain the first current.

11. The apparatus of claim 9, wherein the means for processing the input current with the fast low-gain path comprises means for mirroring the input current to obtain the second current.

12. An integrated circuit comprising:
  a first current mirror configured to implement a fast low-gain path for a dual-path current amplifier; and
  a second current mirror coupled to the first current mirror via an input node and at least one additional node, the first and second current mirrors configured to implement a slow high-gain path for the dual-path current amplifier, wherein a variable input current is app lied to the input node.

13. The integrated circuit of claim 12, wherein the first current mirror comprises
  a first transistor coupled in a diode configuration and configured to receive the input current, and
  a second transistor coupled in parallel with the first transistor and providing an output current mirroring the input current.

14. An integrated circuit comprising:
  a first current mirror configured to implement a fast low-gain path for a dual-path current amplifier; and
  a second current mirror coupled to the first current mirror, the first and second current mirrors configured to implement a slow high-gain path for the dual-path current amplifier, wherein the first current mirror comprises a first transistor coupled in a diode configuration and configured to receive an input current, and a second transistor coupled in parallel with the first transistor and providing an output current mirroring the input current, wherein the first and second transistors have equal dimension, and wherein the fast low-gain path has a gain of one.

15. The integrated circuit of claim 12, wherein the first current mirror comprises first and second transistors coupled in parallel, the first transistor being coupled in a diode configuration, and wherein the second current mirror comprises third and fourth transistors coupled in parallel and further to the first and second transistors, respectively.

16. An integrated circuit comprising:
  a first current mirror configured to implement a fast low-gain path for a dual-path current amplifier, wherein the first current mirror comprises first and second transistors coupled in parallel, the first transistor being coupled in a diode configuration; and
  a second current mirror coupled to the first current mirror, the first and second current mirrors configured to implement a slow high-gain path for the dual-path current amplifier, wherein the second current mirror comprises third and fourth transistors coupled in parallel and further to the first and second transistors, respectively, wherein the first transistor has larger dimension than the second transistor, wherein the third and fourth transistors have equal dimension, and wherein the slow high-gain path has a gain of greater than one.

17. An integrated circuit comprising:
  a first current mirror configured to implement a fast low-gain path for a dual-path current amplifier, wherein the first current mirror comprises first and second transistors coupled in parallel, the first transistor being coupled in a diode configuration; and
  a second current mirror coupled to the first current mirror, the first and second current mirrors configured to implement a slow high-gain path for the dual-path current amplifier, wherein the second current mirror comprises third and fourth transistors coupled in parallel and further to the first and second transistors, respectively, wherein the first and second transistors are P-channel field effect transistors (P-FETs), and wherein the third and fourth transistors are N-channel field effect transistors (N-FETs).

18. An integrated circuit comprising:
  a first current mirror configured to implement a fast low-gain path for a dual-path current amplifier, wherein the first current mirror comprises first and second transistors coupled in parallel, the first transistor being coupled in a diode configuration; and
  a second current mirror coupled to the first current mirror, the first and second current mirrors configured to implement a slow high-gain path for the dual-path current amplifier, wherein the second current mirror comprises third and fourth transistors coupled in parallel and further to the first and second transistors, respectively, and wherein the second current mirror further comprises an operational amplifier having first and second inputs coupled to drains of the third and fourth transistors, respectively, and further having an output coupled to gates of the third and fourth transistors.

19. The integrated circuit of claim 18, wherein the operational amplifier is an operational transconductance amplifier (OTA) configured to detect a voltage difference between the first and second inputs and to provide a current based on the detected voltage difference.

20. The integrated circuit of claim 18, wherein the operational amplifier comprises
  a differential amplifier forming the first and second inputs of the operational amplifier, and
  an active load coupled to the differential amplifier and providing the output of the operational amplifier.

21. The integrated circuit of claim 20, wherein the operational amplifier further comprises a bias transistor having a gate coupled to the gates of the third and fourth transistors and a drain coupled to the differential amplifier.

22. The integrated circuit of claim 18, wherein bias current of the operational amplifier is determined based on current through the fourth transistor.

23. An integrated circuit comprising:
a first current mirror configured to implement a fast low-gain path for a dual-path current amplifier, wherein the first current mirror comprises first and second transistors coupled in parallel, the first transistor being coupled in a diode configuration; and
a second current mirror coupled to the first current mirror, the first and second current mirrors configured to implement a slow high-gain path for the dual-path current amplifier, wherein the second current mirror comprises third and fourth transistors coupled in parallel and further to the first and second transistors, respectively, and wherein the second current mirror further comprises a capacitor coupled between gates of the third and fourth transistors and circuit ground.

24. The integrated circuit of claim 15, wherein the fourth transistor is coupled in a diode configuration and has a gate and a drain coupled together.

25. An integrated circuit comprising:
a first current mirror configured to implement a slow high-gain path for a dual-path current amplifier;
a second current mirror configured to implement a fast low-gain path for the dual-path current amplifier; and
a third current mirror configured to receive an input current for the dual-path current amplifier and to provide first and second input currents for the first and second current mirrors, respectively.

26. The integrated circuit of claim 25, further comprising:
a current summing node configured to receive and sum first and second output currents from the first and second current mirrors, respectively, and to provide an output current for the dual-path current amplifier.

27. The integrated circuit of claim 25, wherein the first current mirror comprises first and second transistors and a capacitor, the first and second transistors being coupled in parallel, the first transistor being coupled in a diode configuration, and the capacitor being coupled between gates of the first and second transistors and AC ground, and wherein the second current mirror comprises third and fourth transistors coupled in parallel, the third transistor being coupled in a diode configuration.

28. The integrated circuit of claim 15, wherein the first current mirror further comprises a fifth transistor coupled in parallel with the first and second transistors and configured to provide an output current.

29. The integrated circuit of claim 15, wherein the first, second, third and fourth transistors operate in a positive feedback loop.

30. The integrated circuit of claim 29, wherein the first, second, third and fourth transistors have a loop gain of less than one to ensure stability of the positive feedback loop.

31. The integrated circuit of claim 25, wherein the first input current is equal to the second input current.

32. The integrated circuit of claim 27, wherein the second transistor has larger dimension than the first transistor to provide a gain of greater than one for the slow high-gain path.

33. The integrated circuit of claim 27, wherein the third and fourth transistors have equal dimension to provide unity gain for the fast low-gain path.

34. The integrated circuit of claim 25, wherein the first, second and third current mirrors are implemented with field effect transistors (FETs).

* * * * *